(12) United States Patent
Romero et al.

(10) Patent No.: US 7,053,674 B1
(45) Date of Patent: May 30, 2006

(54) TRACK-AND-HOLD PEAK DETECTOR CIRCUIT

(75) Inventors: Hernan D. Romero, Buenos Aires (AR); Jay M. Towne, Newbury, NH (US); Karl Scheller, Bow, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 0 days.

(21) Appl. No.: 11/010,704

(22) Filed: Dec. 13, 2004

(51) Int. Cl.
*G11C 27/02* (2006.01)

(52) U.S. Cl. .......................................... 327/94; 327/62
(58) Field of Classification Search ................ 327/91, 327/94–96, 58, 60, 62, 64–65, 67, 70, 73, 327/76, 89–90; 341/122
See application file for complete search history.

(56) References Cited

U.S. PATENT DOCUMENTS

| 5,442,283 | A | | 8/1995 | Vig et al. ............... 324/207.2 |
| 5,864,591 | A | * | 1/1999 | Holcombe ................. 375/345 |
| 6,091,239 | A | * | 7/2000 | Vig et al. ............... 324/207.2 |
| 6,201,426 | B1 | * | 3/2001 | Sumiyoshi et al. .......... 327/291 |
| 6,556,330 | B1 | * | 4/2003 | Holcombe ................. 398/202 |

* cited by examiner

*Primary Examiner*—My-Trang Nu Ton
(74) *Attorney, Agent, or Firm*—Daly, Crowley, Mofford & Durkee, LLP

(57) ABSTRACT

A track-and-hold peak detector circuit, which can operate at low input signal frequencies, includes a capacitor to hold a peak voltage of the input signal and logic circuitry that reduces an effect of leakage current into or out of the capacitor, and therefore, provides protection against self-switching of an output signal of the peak detector circuit.

30 Claims, 9 Drawing Sheets

TRACK-AND-HOLD PEAK DETECTOR CIRCUIT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates to track-and-hold peak detector circuits and, more particularly, to track-and-hold peak detector circuits that use a capacitor to hold a voltage.

BACKGROUND OF THE INVENTION

Track-and-hold peak detector circuits having a capacitor to hold a voltage corresponding to an input signal are known. In conventional track-and-hold peak detector circuits, or more simply, peak detector circuits, it is known that the voltage on the capacitor tends to drift with time due to leakage currents in the capacitor itself and also due to leakage currents in circuitry surrounding the capacitor.

Conventional proximity sensors are also known, which can detect, for example, peaks and/or thresholds associated with an output signal generated by one or more magnetic field sensors in response to presence or absence of a ferrous object, for example, a tooth of a ferrous gear, or in response to presence or absence of a magnet. Within the proximity sensor, the conventional peak detector circuit can be used, to reduce the effect of a DC offset in an output signal provided by one or more magnetic field sensors, e.g., Hall effect sensors. With this arrangement, the peak detector circuit can allow the Hall effect sensors to more accurately detect peaks (and/or thresholds) associated with an AC portion of a signal generated by the Hall effect sensors in response to the passing gear teeth.

In some applications, for example, automobile applications, a proximity sensor and associated peak detector circuit may be required to operate at low input signal frequencies (e.g., one Hz) and high temperatures (e.g., 150 C.). As is known, high temperatures tend to result in relatively high leakage currents, and therefore, a relatively high voltage drift in a voltage held on a capacitor used in the peak detector circuit.

A conventional peak detector circuit, particularly when operating with a low input signal frequency, requires a capacitor with a large capacitance value (typically about 0.1 uf at 10 Hz) in order to accurately hold a voltage in the presence of the leakage currents. As is known, large capacitors are not readily integrated onto a common substrate with other circuitry. Therefore, the conventional peak detector circuit often requires use of an external capacitor. Use of the external capacitor increases sensitivity of the peak detector circuit to electrical noise from external noise sources, which can degrade accuracy and repeatability of the peak detector circuit. The external capacitor also tends to be undesirably large and can also be costly.

Referring now to FIG. 1, a conventional peak detector circuit 10 includes a capacitor 20 having a threshold node 20a. The conventional peak detector circuit 10 also includes a charging circuit 14 having a charging circuit input node 14a to receive an input signal 12 and a charging circuit output node 14b coupled to the threshold node 20a. The conventional peak detector circuit 10 still further includes a comparator 24 having a first comparator input node 24a coupled to the threshold node 20a, a second comparator input node 24b coupled to the charging circuit input node 14a, and a comparator output node 24c.

In operation, the charging circuit 14 provides a charging signal at the charging circuit output node 14b to charge the capacitor 20 to a voltage in accordance the input signal 12. For example, as the input signal 12 rises in voltage, the voltage at the charging circuit output node 14b rises accordingly, charging the capacitor 20 to a voltage according to the input voltage 12. However, because the charging circuit 14 is unable to discharge the capacitor 20, as the input signal 12 falls in voltage, the voltage at the capacitor 20 holds the last highest voltage of the input signal.

The comparator 24 provides a comparator output signal 26 at the comparator output node 24c in response to a voltage difference, Vc–Vi, between the voltage, Vc, at the threshold node 20a and the voltage, Vi, of the input signal 12. The comparator 24 can be arranged having two thresholds to provide hysteresis. As described above, the capacitor 20 holds the peak voltage of the input signal 12 at the threshold node 20a. When the input signal 12 thereafter begins to transition to a lower voltage, crossing an upper comparator threshold (as Vc–Vi increases), a change in state occurs at the comparator output node 24c. The change in state at the comparator output node 24c can be used to detect a peak of the input signal 12.

As described above, a voltage held on the capacitor 20 tends to drift. It will be understood that the voltage drift on the capacitor 20 is generally in a positive direction due to a leakage current 19 through the transistor 18. Therefore, an input signal 12 having a constant or decreasing voltage in combination with an increasing voltage at the holding capacitor 20 due to voltage drift can results in a false change in state at the comparator output node 24c (also referred to here as a self-switching). Furthermore, an input signal having a decreasing voltage in combination with a decreasing voltage at the holding capacitor 20 for example, in the presence of a negative voltage drift, can result in a change in state that is delayed in relation to that which would occur with no voltage drift.

The above-described self-switching is discussed in U.S. Pat. No. 5,442,283, issued Aug. 15, 1995, entitled "Hall-Voltage Slope-Activated Sensor," which is assigned to the assignee of the present invention. The described sensor uses a dual-polarity peak detector. However, the dual-polarity peak detector is also subject to self-switching.

In order to reduce or avoid self-switching, a compensation circuit 28 can provide a compensation current 27 at the threshold node 20a in opposition to the leakage current 19 through the transistor 18, reducing the voltage drift on the capacitor 20. However, because the leakage current 19 through the transistor 18 is only approximately known, and is also known to vary with temperature as described above, the applied compensation current 27 does not exactly compensate for the leakage current 19 at all temperatures.

The compensation circuit 28 can reduce a peak detection accuracy of the peak detector circuit 10. For example, a compensating current 27 that is too high (i.e., over compensated) produces an undesired voltage drift in the opposite direction (negative direction) during a holding time (i.e., the transistor 18 is off), and tends to reduce a detection accuracy of the peak of the input signal 12.

Furthermore, the compensation current 27 can affect a minimum operating frequency of the peak detector circuit 10. For example, after a positive peak of the input signal 12 has passed, if a negative rate of change of the input signal 12 signal is less than or equal to the overcompensated voltage drift (also in the negative direction), then a peak in the input signal 12 will not be detected at all.. A negative rate of change of the overcompensated capacitor voltage is related to the minimum operating frequency of the peak detector Use of the compensation circuit 28 to provide the compensation current 27 opposing the leakage current 19 through the transistor 18 results in a trade-off between self-switching reduction and the minimum operating frequency at which the peak detector circuit 10 can operate properly. The larger the required compensation current 27 used to avoid self switching, the larger the potential overcompensation and the higher the minimum operating frequency become.

From the above discussion, it should be apparent that prior art peak detector arrangements used to reduce self-switching are not suitable for low-frequency high-temperature operation. Furthermore, having an external holding capacitor, prior art peak detectors tend to be relatively large.

SUMMARY OF THE INVENTION

In accordance with the present invention, a circuit includes a capacitor having a threshold node. The circuit also includes either a charging circuit or a discharging circuit. The charging circuit has a charging circuit input node to receive an input signal and a charging circuit output node coupled to the threshold node. The charging circuit is adapted to provide a charging signal at the charging circuit output node to charge the capacitor to a voltage in accordance with a positive peak of the input signal. The discharging circuit has a discharging circuit input node to receive the input signal and a discharging circuit output node coupled to the threshold node. The discharging circuit is adapted to provide a discharging signal at the discharging circuit output node to discharge the capacitor to a voltage in accordance with a negative peak of the input signal.

The circuit still further includes a comparator having a first comparator input node coupled to the threshold node, a second comparator input node coupled to the charging circuit input node or the discharging circuit input node, and a comparator output node at which a comparator output signal is provided. The circuit still further includes a logic circuit having a logic circuit input node coupled to the comparator output node and a logic circuit output node at which a logic circuit output signal is provided in response to a predetermined period of time during which the comparator output signal has no transitions. Also provided, a switch has a first switch node coupled to the threshold node, a second switch node coupled to the charging circuit input node or the discharging circuit input node, and a switch control node coupled to the logic circuit output node.

In accordance with another aspect of the present invention, a circuit includes a capacitor having a threshold node. The circuit also includes a charging/discharging circuit. The charging/discharging circuit includes a charging circuit having a charging circuit input node to receive an input signal, a charging circuit output node coupled to the threshold node, and an enable node. The charging/discharging circuit also includes a discharging circuit having a discharging circuit input node to receive the input signal, a discharging circuit output node coupled to the threshold node, and an inverted enable input node. The charging circuit is adapted to provide a charging signal at the charging circuit output node to charge the capacitor to a voltage in accordance with a positive peak of the input signal and the discharging circuit is adapted to provide a discharging signal at the discharging circuit output node to discharge the capacitor to a voltage in accordance with a negative peak of the input signal. The circuit further includes a comparator having a first comparator input node coupled to the threshold node, a second comparator input node coupled to the charging and discharging circuit input nodes, and a comparator output node at which a comparator output signal is provided. A logic circuit has a logic circuit input node coupled to the comparator output node and a logic circuit output node coupled to the enable input node and to the inverted enable input node. A selected one of a first logic circuit output signal and a second logic circuit output signal is provided at the logic circuit output node in response to a predetermined period of time during which the comparator output signal has no transitions.

In accordance with another aspect of the present invention, a circuit includes a first capacitor having a first threshold node and second capacitor having a second threshold node. The circuit also includes a charging/discharging circuit having at least two charging/dischargingcircuit input nodes to receive an input signal and an inverted input signal, at least two charging/discharging circuit output nodes coupled respectively to the first threshold node and to the second threshold node, and an enable/disable node. The charging/dischargingcircuit is adapted to provide charging signals at the at least two charging/discharging circuit output nodes to charge the first capacitor to a voltage in accordance with a positive peak of the input signal and to charge the second capacitor to a voltage in accordance with a positive peak of the inverted input signal. The charging/discharging circuit is further adapted to provide discharging signals at the at least two charging/discharging circuit output nodes to discharge the first capacitor to a voltage in accordance with a negative peak of the input signal and to discharge the second capacitor to a voltage in accordance with a negative peak of the inverted input signal. The circuit also includes a comparator having first differential comparator input nodes coupled to the first and second threshold nodes, second differential comparator input nodes coupled to respective ones of the at least two charging/discharging circuit input nodes, and a comparator output node at which a comparator output signal is provided. The circuit still further includes a logic circuit having a logic circuit input node coupled to the comparator output node and a logic circuit output node coupled to the enable/disable node. A selected one of a first logic circuit output signal and a second logic circuit output signal is provided at the logic circuit output node in response to a predetermined period of time during which the comparator output signal has no transitions.

With the above arrangements, circuits are provided that can avoid the effect of a voltage drift on a capacitor used in a peak detector circuit. By avoiding the effect of the voltage drift, the capacitor can be made smaller in value, size, and cost, while maintaining a very low operating frequency.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the peak detector circuit, some introductory concepts and terminology are explained. As used herein, the term "proximity sensor" refers to a circuit that can detect peaks and/or thresholds associated with an output signal generated by one or more magnetic field sensors in response to presence or absence of a ferrous object, for example, a tooth of a ferrous gear, or in response to presence or absence of a magnet.

Figure 1:
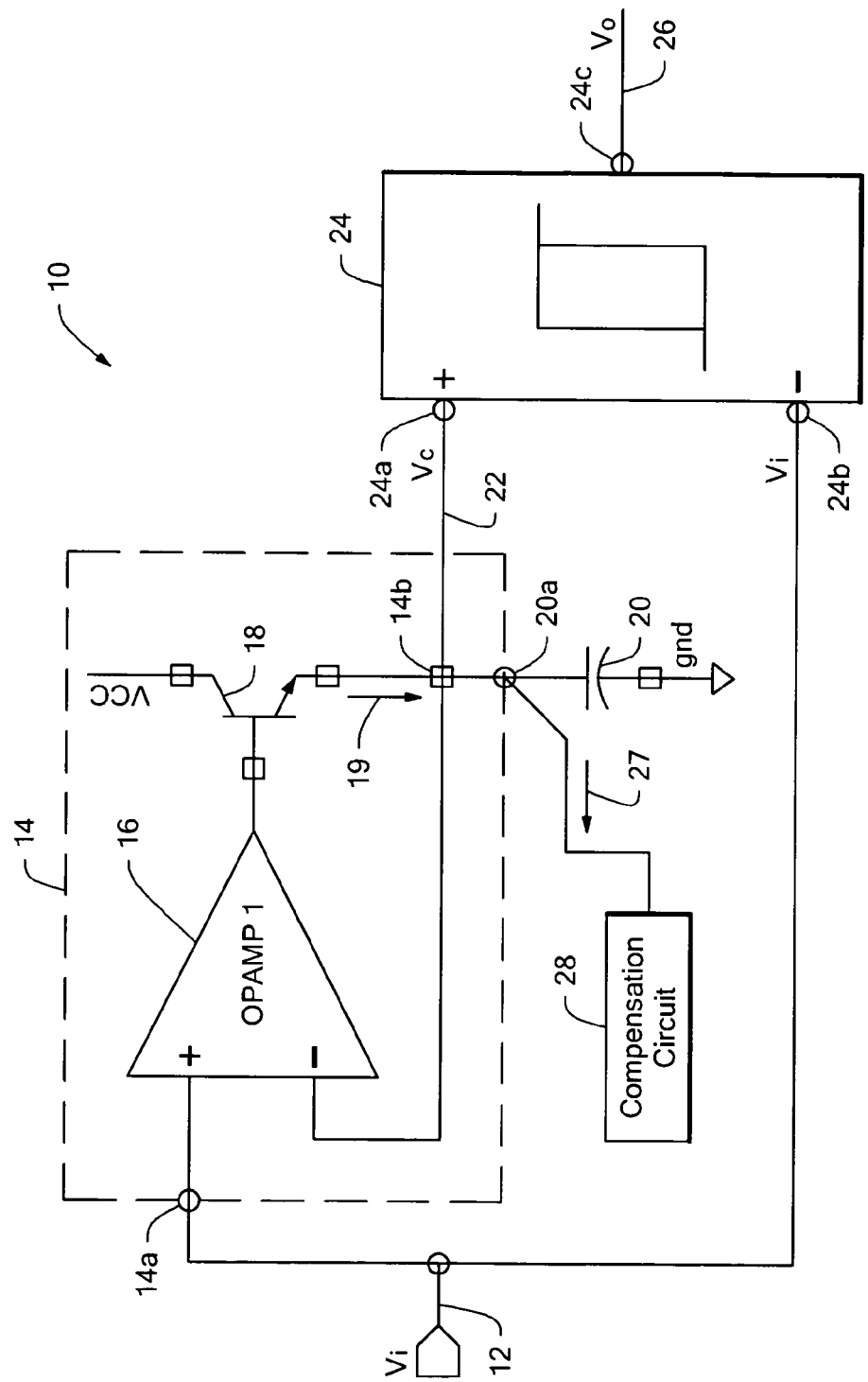
FIG. 1 is a block diagram of a prior art circuit.
Figure 2:
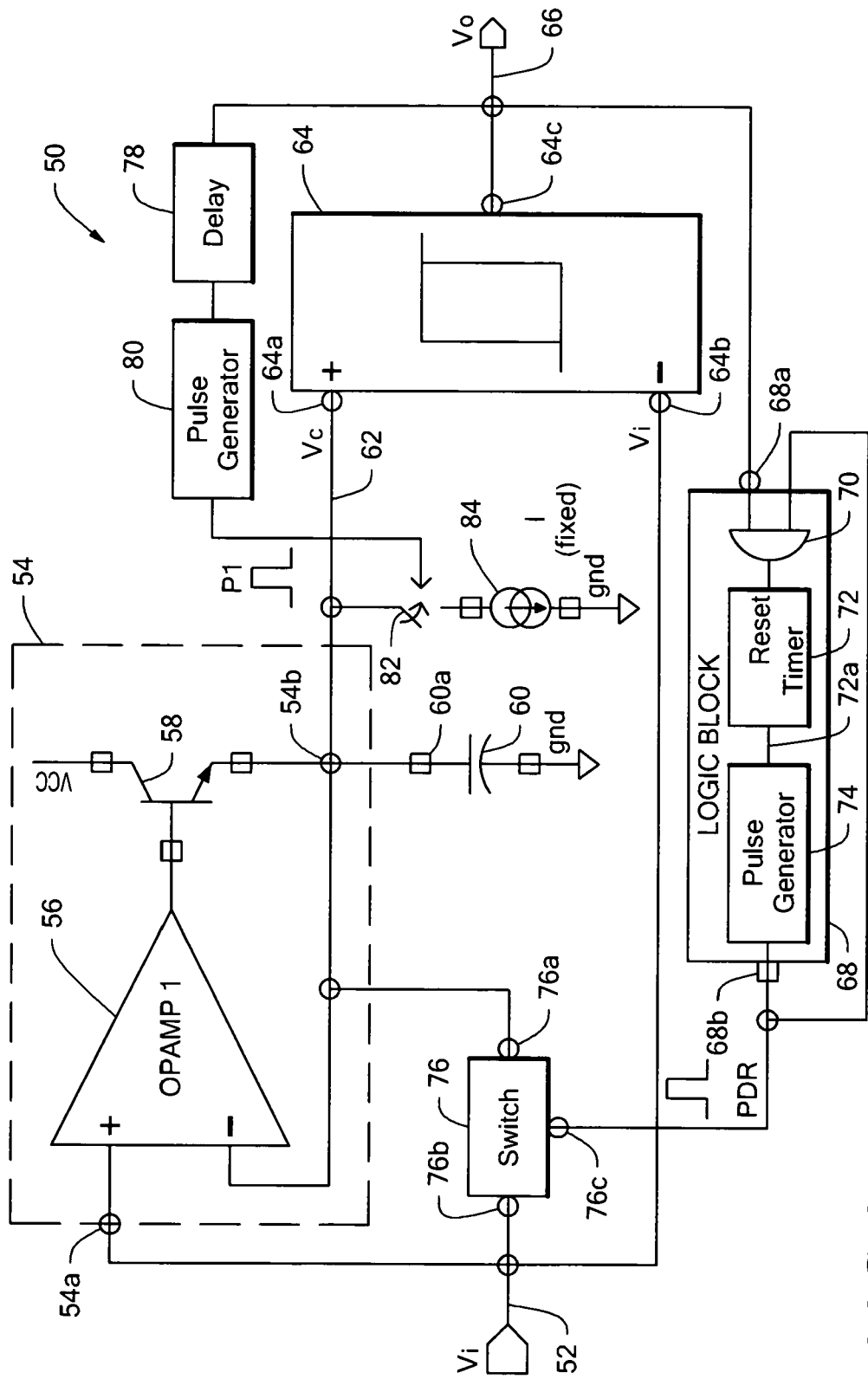
FIG. 2 is a block diagram of a circuit able to detect positive peaks of an input signal in accordance with the present invention.

Referring to FIG. 2, a circuit 50 includes a capacitor 60 having a threshold node 60a. The circuit 50 also includes a charging circuit 54 having a charging circuit input node 54a to receive an input signal 52 and a charging circuit output node 54b coupled to the threshold node 60a. The circuit 50 is responsive to positive peaks of the input signal 52. A similar circuit, which is responsive to negative peaks of the input signal, is shown below in FIG. 9.

The circuit 50 also includes a comparator 64 having a first comparator input node 64a coupled to the threshold node 60a, a second comparator input node 64b coupled to the charging circuit input node 54a, and a comparator output node 64c at which a comparator output signal 66 is provided. The comparator 64 provides the comparator output signal 66 at the comparator output node 64c in response to a voltage difference, Vc–Vi, between a voltage, Vc, at the threshold node 60a and a voltage, Vi, of the input signal 52. The comparator 64 can be arranged having two thresholds to provide hysteresis, an upper threshold and a lower threshold.

The circuit 50 still further includes a logic circuit 68 having a logic circuit input node 68a coupled to the comparator output node 64c and a logic circuit output node 68b at which a logic circuit output signal, also referred to herein as a "peak detector reset" (PDR) signal, is provided in response to a predetermined period of time during which the comparator output signal 66 has no transitions. The circuit 50 still further includes a switch 76 having a first switch node 76a coupled to the threshold node 60a, a second switch node 76b coupled to the charging circuit input node 54a, and a switch control node 76c coupled to the logic circuit output node 68b. In some embodiments, the circuit 50 also includes a delay module 78, a pulse generator 80, a switch 82, and a current source 84.

In some embodiments, the charging circuit 54 includes an amplifier 56 and a transistor 58. In some further embodiments, the logic circuit 68 includes a gate 70, a timer 72, and a pulse generator 74 (monostable multivibrator). Also, in some embodiments, at least the capacitor 60, the charging circuit 54, the comparator 64, the logic circuit 68, and the switch 76 are provided on a common substrate.

In operation, the charging circuit 54 provides a charging signal at the charging circuit output node 54b to charge the capacitor 60 to a voltage in accordance with a positive peak of the input signal 52. The charging circuit 54 can only charge the capacitor 60. Therefore, upon reaching the positive peak voltage of the input signal 52, the capacitor 60 holds the positive peak voltage of the input signal 52 at the threshold node 60a. When the input signal 52 thereafter begins to transition to a lower voltage, causing the voltage difference, Vc–Vi, to increase and cross the upper threshold of the comparator 64, a change in state, for example, a change to a high state, occurs at the comparator output node 64c. Therefore, the change in state at the comparator output node 64c can be used to detect a first positive peak of the input signal 52.

The pulse generator 80 generates pulse, P1, shortly after each transition of the output signal 66 to a high state, at a time in accordance with the delay module 78. The pulse, P1, operates via the switch 82 and the current source 84 to move the voltage at the threshold node 60a slightly downward. The shift in voltage at the threshold node 60a results in the comparator output signal 66 taking on a low state (i.e., resetting the comparator 64) when the input signal 52 reaches the voltage at the threshold node 60a. The circuit 50, therefore, becomes ready to detect the next positive peak of the input signal 52. The above-described resetting of the comparator 64 will be further understood from the discussion below in conjunction with FIG. 4.

In a first mode of operation of the logic circuit 68, achieved when the input signal 52 is varying in voltage, the logic circuit 68 generates a steady state (DC) PDR signal (e.g., a low state) at the logic circuit output node 68b. In the first mode of operation, the timer 72 is repeatedly reset by changes in state of the comparator output signal 66 caused by the varying input voltage 52, resulting in the continual low state at the logic circuit output node 68b. In this mode of operation, the switch 76 remains open and the circuit 50 operates as described above.

In a second mode of operation of the logic circuit 68, achieved when the input signal 52 is slowly varying or DC, the logic circuit 68 generates a PDR signal having high and low states (i.e., PDR pulses) at the output node 68b. In this mode of operation, the output of the comparator 64 either has transitions widely spaced in time or no transitions, respectively, resulting in either widely spaced resets to the timer 72 or no resets, respectively. Taking, for example, a DC input signal 52, which results in no resets applied to the timer 72, the timer 72 counts up to a terminal count in a predetermined amount of time, at which time an output 72a of the timer 72 makes a transition, causing the pulse generator 74 (e.g., monostable multivibrator) to output a high state PDR signal (a PDR pulse) at the logic circuit output node 68b.

The PDR signal is received by the switch 76 at the switch control node 76c. During a time when the PDR signal is in the high state, i.e., during the PDR pulse, the capacitor 60 is coupled to the input signal 52 by way of the switch 76, forcing the voltage on the capacitor 60 (which may otherwise be experiencing voltage drift) to substantially equal the voltage of the input signal 52, and therefore, forcing the voltage at the threshold node 60a, to take on the voltage of the input signal 52 (i.e., Vc−Vi=0). It will be recognized that this condition prevents switching of the comparator 64.

The PDR signal is also coupled to a gate 70 and forces the timer 72 to reset. When the PDR pulse terminates (i.e., the state at the node 68b returns to its original state), the timer 72 again counts, again reaching its terminal count after the predetermined time and another PDR pulse is generated. With this arrangement, the logic circuit 68 continually generates PDR pulses so long as the input signal 52 remains generally unchanged. It will be recognized that PDR pulses can also be generated for an input signal 52 that is slowly varying.

In the second mode of operation of the logic circuit 68, during a time when the PDR signal is at a low state, i.e., between PDR pulses, the circuit 50 operates as described above in the first mode of operation of the logic circuit 68.

When in the above-described second mode of operation of the logic circuit 68, self-switching of the comparator 64 is reduced or eliminated so long as the voltage at the threshold node 60a is not allowed to deviate very far from the voltage of the input signal 52, which can be accomplished by generating PDR pulses sufficiently close together. The above-described reduction of self-switching will be further understood from the discussion below in conjunction with FIG. 3.

Figure 3:
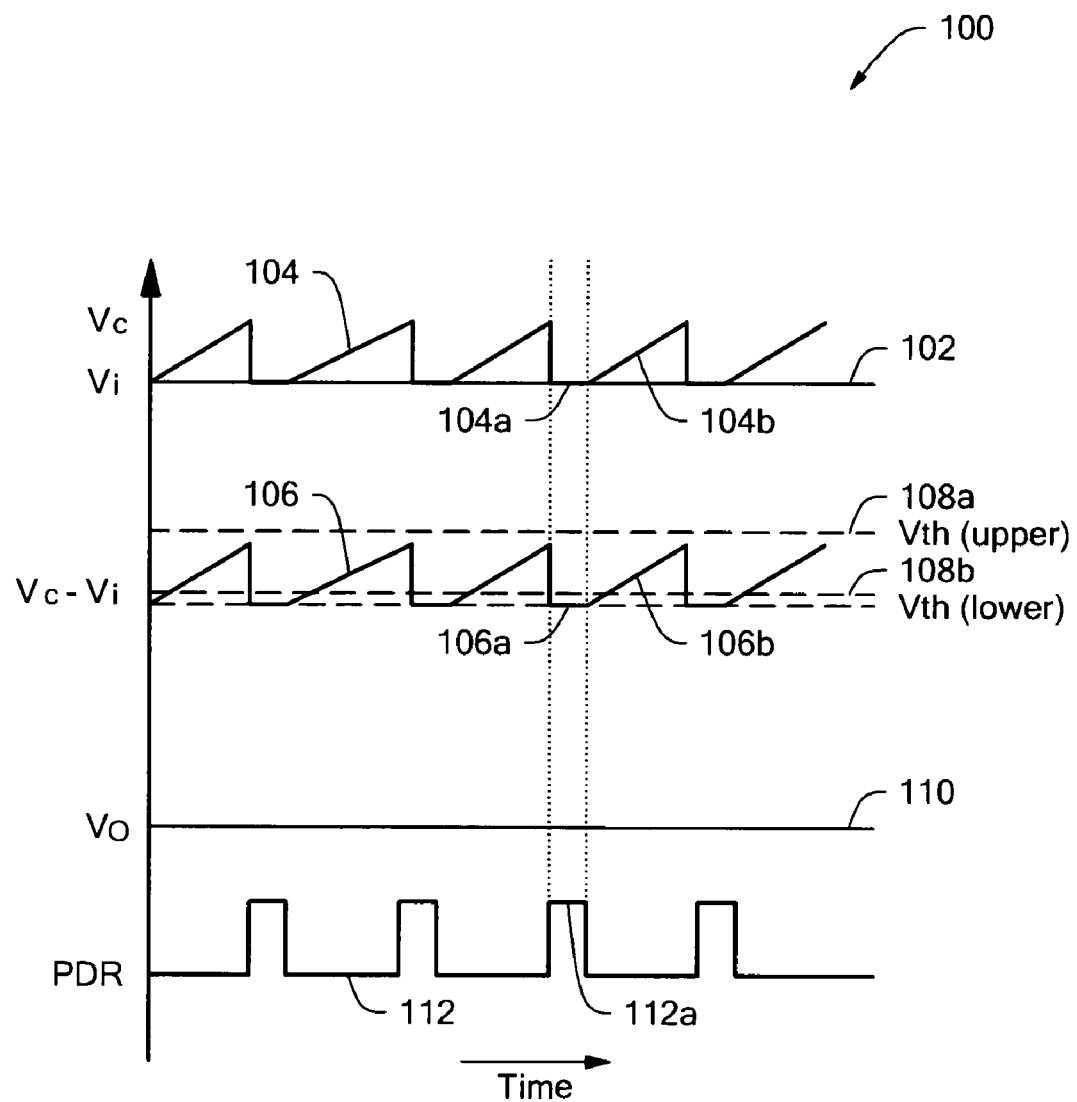
FIG. 3 is a graph showing details of the operation of the circuit of FIG. 2.

Referring now to FIG. 3, a graph 100 has a horizontal scale in units of time and vertical scales in units of voltage. A curve 102 is indicative of a DC input voltage 52 (FIG. 2). A curve 104 is representative of a voltage appearing at the threshold node 60a of FIG. 2 when the logic circuit 68 of FIG. 2 is operating in the above-described second mode of operation. The curve 104 has flat portions, of which a flat portion 104a is but one example, and sloping portions, of which a sloping portion 104b is but one example. The sloping portions, e.g., 104b, are representative of a positive going voltage drift on the capacitor 60 (FIG. 2) occurring when the transistor 58 (FIG. 2) is off. The flat portions, e.g., 104a, are representative of the voltage 104 on the capacitor being forced to equal the input voltage 102 via the switch 76 (FIG. 2) as is further described below.

A curve 106 is representative of the voltage difference, Vc−Vi, between the voltage, Vc, appearing at the threshold node 60a of FIG. 2 (curve 104) and the input voltage 52, Vi, (curve 102) when the logic circuit 68 of FIG. 2 is operating in the above-described second mode of operation. It can be recognized that the voltage difference, Vc−Vi, is also a difference between the voltage on the two inputs 64a, 64b of the comparator 64 of FIG. 2. The curve 106 has flat portions, of which a portion 106a is but one example, and sloping portions, of which a portion 106b is but one example. The sloping portions, e.g., 106b, are representative of the positive going voltage drift on the capacitor 60. The flat portions, e.g., 106a, are representative of the voltage 104 on the capacitor 60 being forced to equal the input voltage 102 via the switch 76.

Two thresholds 108a, 108b correspond to the upper and lower thresholds, respectively, of the comparator 64 (FIG. 2). The thresholds 108a, 108b have levels according to a predetermined hysteresis associated with the comparator 64. It should be appreciated that the voltage difference, Vc−Vi, corresponding to the curve 106, does not reach a voltage of the threshold 108a when the logic circuit 68 is operating in the above-described second mode of operation.

A curve 110 is representative of the output voltage 66 appearing at the comparator output node 64c (FIG. 2). Because the curve 106 does not reach a voltage corresponding to the threshold 108a, the comparator 64 (FIG. 2) does not change state, and the curve 110 remains at an unchanged state, here shown to be a low state.

A curve 112 shows the PDR signal (FIG. 2) having the PDR pulses, of which pulse 112a is but one example, appearing at the logic circuit output 68b of FIG. 2 when the logic circuit 68 is operating in the above-described second mode of operation. Each of the PDR pulses aligns in time and result in a respective flat portion of the curves 104, 106. Each PDR pulse forces the voltage at the threshold node 60a to equal the input voltage 52 while the PDR pulse is high, for example, by way of the switch 76 of FIG. 2.

Voltage on the capacitor 60 having voltage drift corresponding to the sloping portions of the curves 104 and 106 would tend to cross the threshold 108a, resulting in a change of state of the comparator 64 (self-switching). However, it should be recognized that the PDR pulses keep the positive voltage drift associated with the curves 104, 106 from crossing the comparator threshold 108a, and therefore, the PDR pulses keep the comparator 66 from self-switching in the presence of the voltage drift.

It should be still further recognized that similar advantages would be achieved if the output voltage 66 of the comparator 64 represented by the curve 110 were in a positive state instead of a zero state.

While a DC input voltage 52 corresponding to the curve 102 is shown, it will be appreciated that the same concepts apply to a slowly varying input voltage 52.

Figure 4:
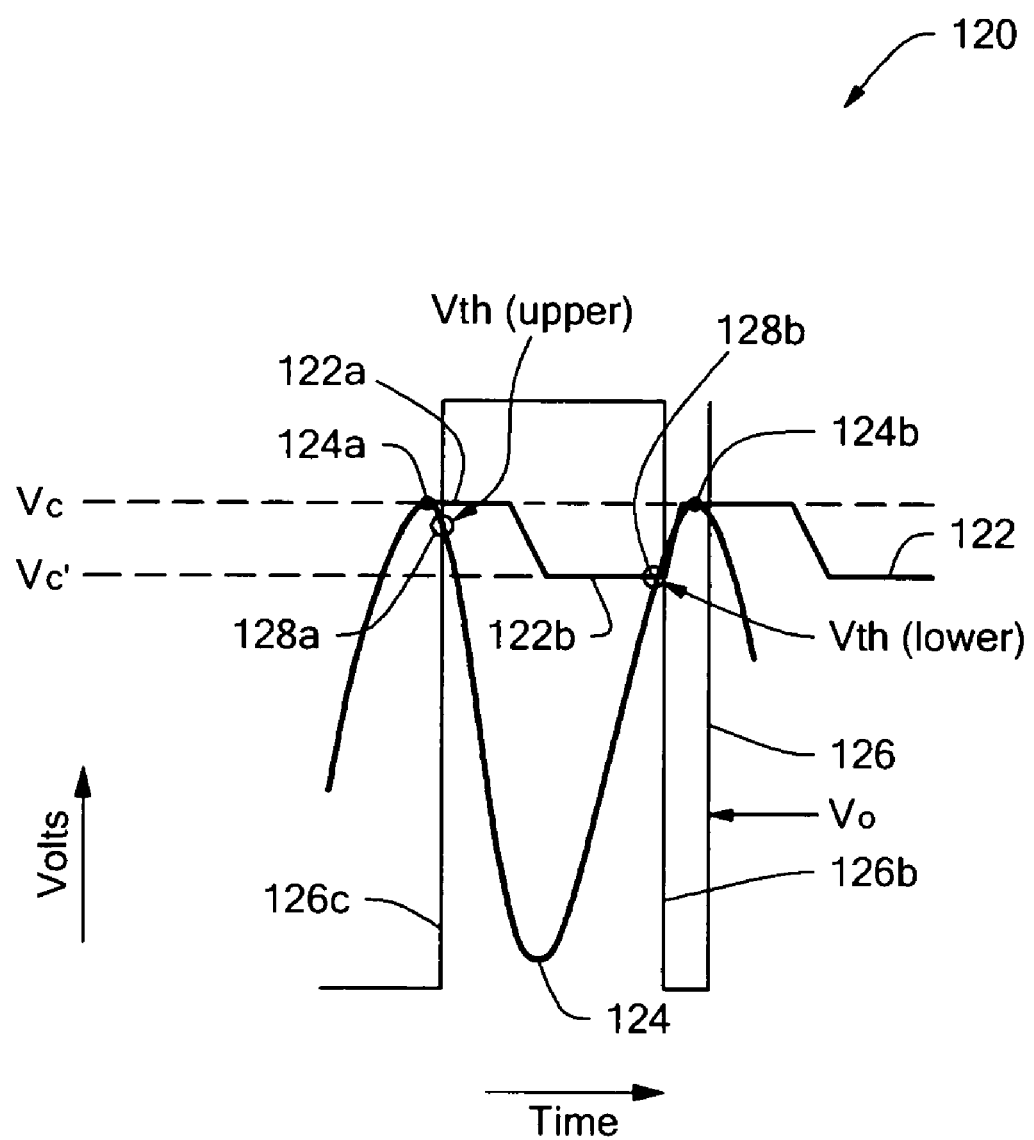
FIG. 4 is a graph showing further details of the operation of the circuit of FIG. 2.

Referring now to FIG. 4, a graph 120 shows operation of the circuit 50 of FIG. 2 resulting from the delay module 78, the pulse generator 80, the switch 82, and the current source 84 of FIG. 2. The graph 120 has a horizontal scale in units of time and a vertical scale in units of voltage. A curve 124 having peaks 124a, 124b corresponds to the input signal 52 of FIG. 2. A curve 122 corresponds to the voltage on the capacitor 60 (FIG. 2), i.e., at the threshold node 60a (FIG. 2). A curve 126 corresponds to the output signal 66 (FIG. 2) appearing at the output node 64c (FIG. 2) of the comparator 64 (FIG. 2). First and second levels, Vc and Vc', respectively, correspond to two levels of voltage on the capacitor 60. The first voltage level, Vc, corresponds to the peak value of the input signal 124 held on the capacitor 60. The second voltage level, Vc', corresponds to the peak value of the input signal 124 held on the capacitor 60 but reduced by a predetermined amount by way of the delay 78, the pulse generator 80, the switch 82, and the current source 84 of FIG. 2. It can be seen that the second voltage level, Vc', is achieved at some time after the peaks 124a, 124b of the input signal 124 in accordance with the delay module.

In the graph 120, the input signal 124 is varying, and therefore, the PDR pulses 112 of FIG. 3 are not generated by the logic circuit 68 (FIG. 2) and the logic circuit 68 (FIG. 2) is operating in the above-described first mode of operation.

In operation, a rising edge 126a of the curve 126 is indicative of detection of a first peak 124a of the input signal 124. Essentially, a voltage difference, Vc−Vi, between a voltage, Vc, on the capacitor 60 (curve 122) and a voltage, Vi, of the input signal 52 (curve 124) exceeds an upper comparator threshold (e.g., threshold 108a of FIG. 3) at a point 128a, resulting in a change of state of the comparator 64, i.e., the edge 126a. If the voltage on the capacitor 60 were to remain at the level, Vc, then the comparator output signal 126 would remain high and the second peak 124b of the input signal 124 would not result in another transition of the comparator output signal 126, i.e., the second peak 124b would not be detected. However, because the capacitor voltage corresponding to the curve 122 is forced to the lower voltage, Vc' by operation of the delay 78, the pulse generator 80, the switch 82, and the current source 84, then at a point 128b, the voltage difference, Vc–Vi, between the voltage, Vc', on the capacitor 60 (curve 122) and the input voltage, Vi, (curve 124) exceeds a low comparator threshold (e.g., threshold 108b of FIG. 3), resulting in a change of state of the comparator 64, i.e., the edge 126b. Thereafter the peak 124b can be detected as described above in essentially the same way that the peak 124a is detected.

Figure 5:
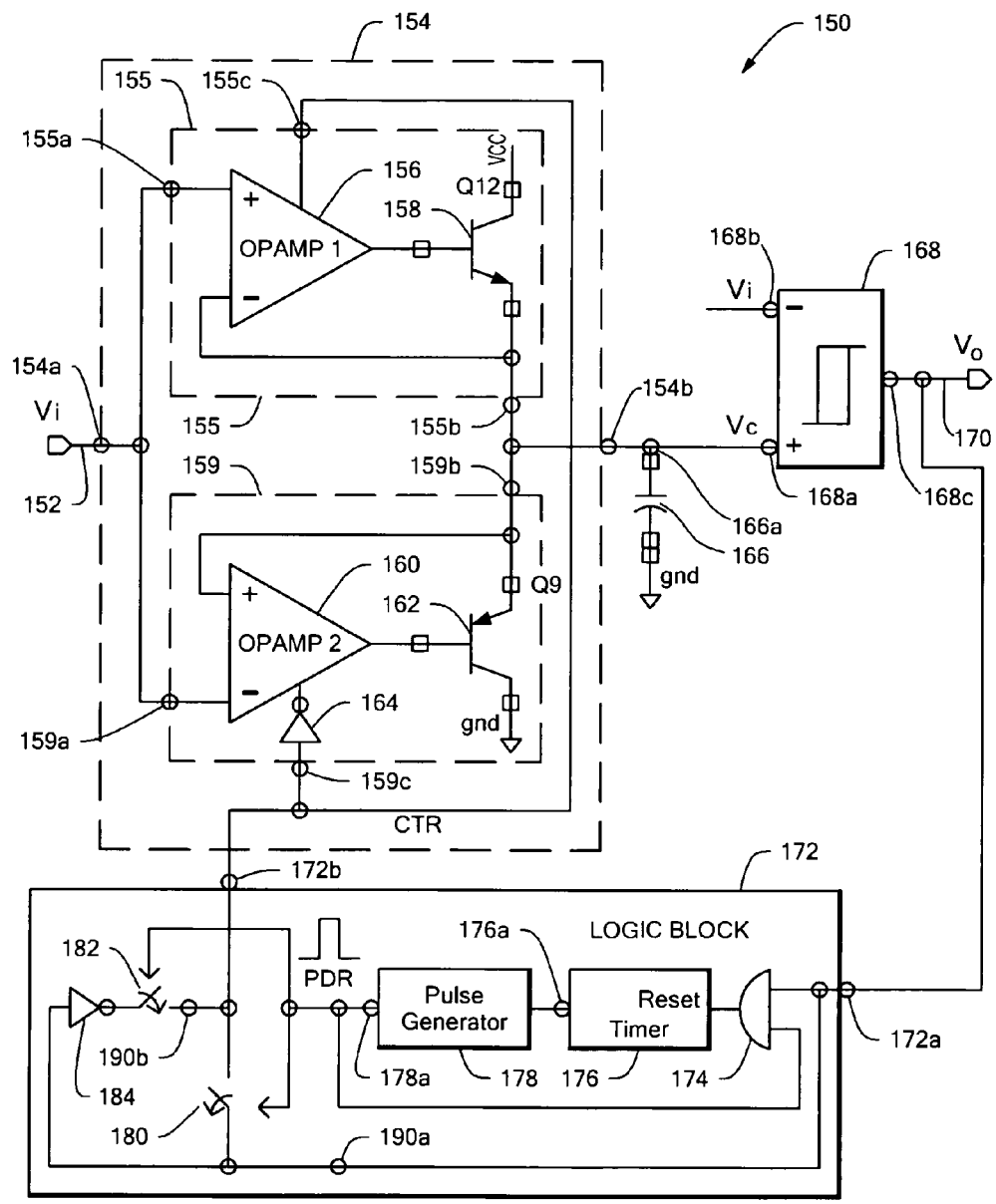
FIG. 5 is a block diagram of a circuit able to detect positive and negative peaks of an input signal in accordance with a further embodiment of the invention.

Referring now to FIG. 5, a circuit 150 includes a capacitor 166 having a threshold node 166a. The circuit 150 also includes a charging/discharging circuit 154 having a charging circuit 155 and a discharging circuit 159. The charging circuit 155 has a charging circuit input node 155a to receive an input signal 152, a charging circuit output node 155b coupled to the threshold node 166a, and an enable node 155c. The discharging circuit 159 has a discharging circuit input node 159a to receive the input signal 152, a discharging circuit output node 159b coupled to the threshold node 166a, and an inverted enable input node 159c.

The circuit 152 also includes a comparator 168 having a first comparator input node 168a coupled to the threshold node 166a, a second comparator input node 168b coupled to the charging circuit input node 155a and to the discharging circuit input node 159a, and a comparator output node 168c at which a comparator output signal 170 is provided. The comparator 168 provides the comparator output signal 170 at the comparator output node 168c in response to a voltage difference, Vc–Vi, between a voltage, Vc, at the threshold node 166a and a voltage, Vi, of the input signal 152. The comparator 168 can be arranged having two thresholds to provide hysteresis, an upper threshold and a lower threshold.

The circuit 152 still further includes a logic circuit 172 having a logic circuit input node 172a coupled to the comparator output node 168c and a logic circuit output node 172b coupled to the enable input node 155c and to the inverted enable input node 159c. In some embodiments, the logic circuit 172 includes a gate 174, a timer 176, a pulse generator 178, a first switch 180, a second switch 182, and an inverter 184. A selected one of a first logic circuit output signal 190a and a second logic circuit output signal 190b is provided at the logic circuit output node 172b in response to a predetermined period of time during which the comparator output signal 170 has no output signal transitions.

In some embodiments, the charging circuit 155, and the discharging circuit 159 include an amplifier 156, 160, respectively, and a transistor 158, 162, respectively. In some further embodiments, at least the capacitor 166, the charging/discharging circuit 154, the comparator 168, and the logic circuit 172 are provided on a common substrate (not shown).

In operation, the charging circuit 155 and the discharging circuit 159 are enabled and disabled, respectively, or disabled and enabled, respectively, in accordance with a state of a control signal, CTR, applied to the enable input 155c and to the inverted enable input 159c. When enabled, the charging circuit 155 provides a charging signal at the charging circuit output node 155b to charge the capacitor 166 to a voltage in accordance with a positive peak of the input signal 152. When enabled, the discharging circuit 159 provides a discharging signal at the second discharging circuit output node 159b to discharge the capacitor 166 to a voltage in accordance with a negative peak of the input signal 152.

When the charging circuit 155 is enabled, which can only charge the capacitor 166, reaching the positive peak voltage of the input signal 152 results in the capacitor 166 holding the positive peak voltage of the input signal 152 at the threshold node 166a. When the input signal 152 thereafter begins to transition to a lower voltage, causing the voltage difference, Vc–Vi, to increase and cross a threshold of the comparator 168, a change in state occurs at the comparator output node 168c.

More specifically, once enabled, the charging circuit 155 tends to force a voltage on the capacitor 166 that follows the voltage of the input signal 152 as it moves upward, causing both comparator inputs 168a, 168b to become substantially equal, i.e., Vc–Vi is substantially equal to zero. Having substantially equal voltages, the voltage difference, Vc–Vi, remains between the two thresholds of the comparator 166 while the input signal 152 moves upward in voltage, and the output signal 170 of the comparator 168 remains in the low state. Operation of the charging circuit 155 will be further understood from the discussion of FIG. 6 below.

When the discharging circuit 159 is enabled, which can only discharge the capacitor 166, reaching the negative peak voltage of the input signal 152 results in the capacitor 166 holding the negative peak voltage of the input signal 152 at the threshold node 166a. When the input signal 152 thereafter begins to transition to a higher voltage, causing the voltage difference, Vc–Vi, to decrease and cross a threshold of the comparator 168, another change in state occurs at the comparator output node 168c.

More specifically, once enabled, the discharging circuit 159 tends to force a voltage on the capacitor 166 that follows the voltage of the input signal 152 as it moves downward away from the positive peak of the input signal 152, causing both comparator inputs 168a, 168b to become substantially equal, i.e., Vc–Vi is substantially equal to zero. Having the substantially equal input voltages, the voltage difference, Vc–Vi, remains between the two thresholds of the comparator 168 while the input signal 152 moves downward in voltage, and the output signal 170 of the comparator 168 remains in the high state. Operation of the discharging circuit 159 is further described below in conjunction with FIG. 6.

In a first mode of operation of the logic circuit 172, achieved when the input signal 152 is varying in voltage, the logic circuit 172 generates a steady state (DC) PDR signal at the logic circuit output node 168b. In the first mode of operation, the timer 176 is repeatedly reset by changes in state of the comparator output signal 170 caused by the varying input signal 152. In this mode of operation, the pulse generator 178 remains in a low state resulting in the first switch 180 being closed and the second switch 182 being open. Therefore, the output signal 170 of the comparator 168 is directed to the logic circuit output node 172b, and the comparator output signal 170 becomes the control signal, CTR. When the CTR signal is low (i.e., the comparator output signal 170 is low), the charging circuit 155 is enabled and the discharging circuit 159 is disabled. Conversely, when the CTR signal is high (i.e., the comparator output signal 170 is high), the charging circuit 155 is disabled and the discharging circuit 159 is enabled.

In a second mode of operation of the logic circuit 172, achieved when the input signal 152 is slowly varying or DC, the output of the comparator 168 either has transitions widely spaced in time or no transition, respectively, resulting in either widely spaced resets or no resets applied to the timer 176. Taking, for example, a DC input signal 152, which results in no resets applied to the timer 176, the timer 176 counts up to a terminal count in a predetermined amount of time, at which time an output 176a of the timer 176 provides a transition, causing the pulse generator 178 (e.g., monostable multivibrator) to output a high state PDR signal (i.e., a PDR pulse) at a pulse generator output node 178a.

While the PDR signal is high, the first switch 180 is open and the second switch 182 is closed resulting in the inverse of the comparator output signal 170 being directed to the logic circuit output node 172b, and the inverse of the comparator output signal 170, via the inverter 184, becomes the control signal, CTR. In this condition, the charging circuit 155 is enabled and the discharging circuit 159 is disabled when the CTR signal is low (i.e., the comparator output signal 170 is high) and the charging circuit 155 is disabled and the discharging circuit 159 is enabled when the CTR signal is high (i.e., the comparator output signal 170 is low).

While the PDR signal is low, the first switch 180 is closed and the second switch 182 is open resulting in the comparator output signal 170 being directed to the logic circuit output node to become the control signal, CTR. In this condition, the charging circuit 155 is enabled and the discharging circuit 159 is disabled when the CTR signal is low (i.e., the comparator output signal 170 is low) and the charging circuit 155 is disabled and the discharging circuit 159 is enabled when the CTR signal is high (i.e., the comparator output signal 170 is high).

It will become apparent from the discussion below in conjunction with FIGS. 6 and 7 that enabling the charging circuit 155 or the discharging circuit 159 can avoid self-switching of the comparator 168.

The PDR signal is also coupled to the gate 174, and when a PDR pulse appears on the PDR signal, the timer 176 is reset. When the PDR pulse terminates, the timer 176 again counts, reaching its terminal count after the predetermined time and another PDR pulse is generated. With this arrangement, the logic circuit 172 continually generates PDR pulses so long as the input signal 152 remains unchanged or slowly varying.

In order to operate properly, the timer 72 must be adjusted so that the voltage difference Vc–Vi does not reach a threshold or the comparator 64. For example, in on particular embodiment, the capacitor 60 has a value of 100 pf and a net leakage current of 10 pa. The resulting voltage drift is about 0.1 mv/ms. For a comparator threshold of 100 mv, a timer count associated with the timer 72 should be selected to elapse before one second in order to avoid self-switching. With the selected timer elapsed time, in order to detect peaks of the input signal 52, the input signal 52 must have a rate of change higher than 100 mv/1 s. For a 1 Vpp sinusoidal input signal 52, this corresponds to minimum input signal operating frequency of 0.32 Hz.

Figure 6:
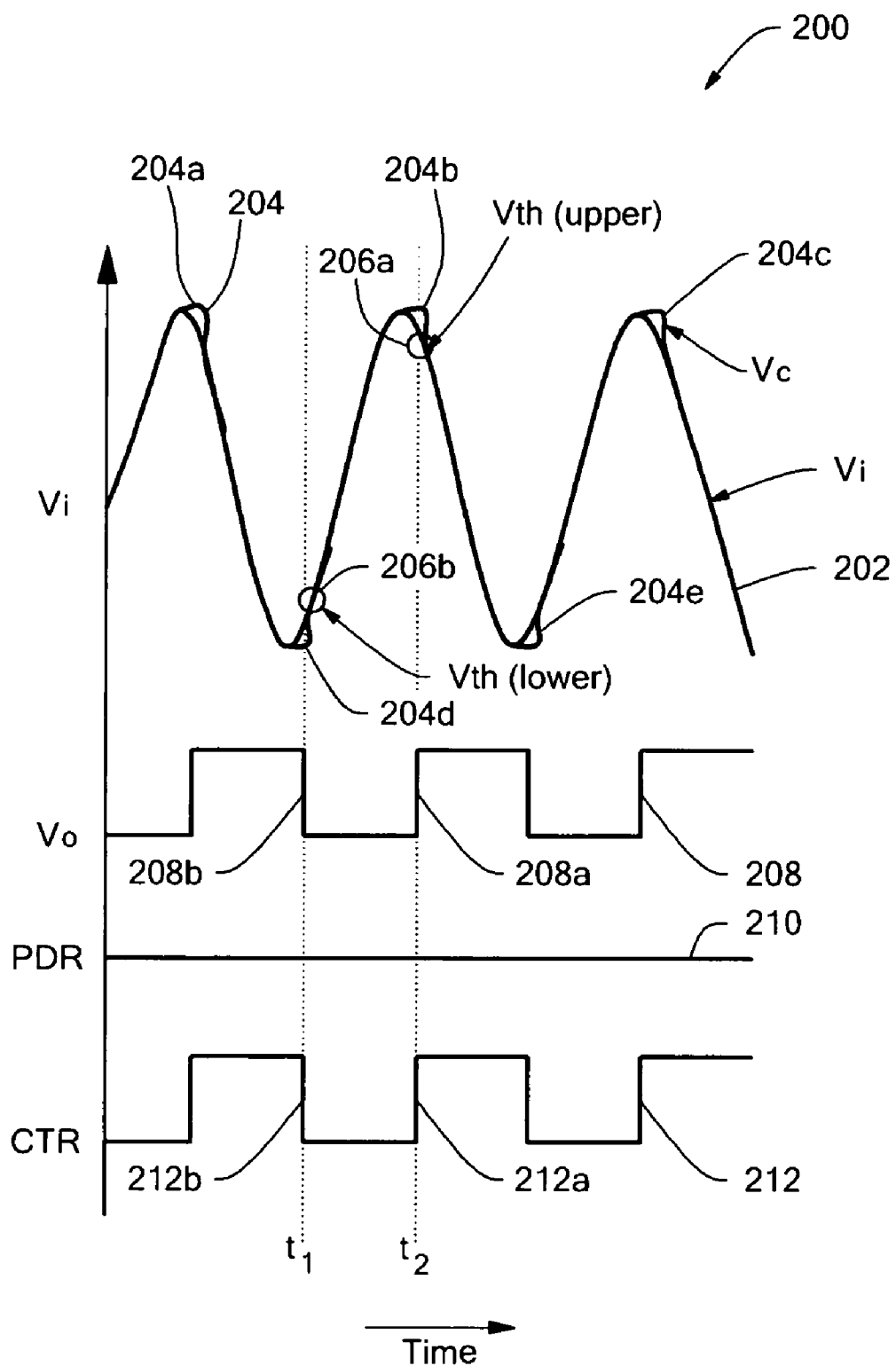
FIG. 6 is a graph showing details of the operation of the circuit of FIG. 5.

Referring now to FIG. 6, a graph 200 has a horizontal scale in units of time and a vertical scale in units of voltage. A first curve 202 corresponds to the input signal 152 of FIG. 5. A curve 204 has portions 204a–204c corresponding first to a voltage held on the capacitor 166 in accordance with a positive peak of the input signal 202 and thereafter to a voltage on the holding capacitor 166 being forced to equal the voltage of the input signal 202 by operation of the discharging circuit 159 (FIG. 5). Curve portions 204d–204e correspond first to a voltage held on the capacitor 166 in accordance with a negative peak of the input signal 202 and thereafter to a voltage on the holding capacitor being forced to equal the voltage of the input signal 202 by operation of the charging circuit 155 (FIG. 5).

A point 206a corresponds to a time, t2, at which the voltage difference, Vc–Vi, between the capacitor voltage 204b and the input signal 202 exceeds an upper threshold, Vth (upper), of the comparator 168 (FIG. 5). A point 206b corresponds to a time, t1, at which the voltage difference, Vc–Vi, between the capacitor voltage 204d and the input signal 202 goes below a lower threshold, Vth (lower), of the comparator 168.

A curve 208 corresponds to the output signal 170 (FIG. 5) generated by the comparator 168. A rising edge 208a at the time, t2, aligns with the point 206a and a falling edge 208b at the time, t1, aligns with the point 206b.

A curve 210 corresponds to a voltage appearing at the pulse generator output node 178a (FIG. 5) indicating that the PDR pulses are not present (i.e., the logic circuit 172 (FIG. 5) is operating in the first mode of operation).

A curve 212 corresponds to the control signal, CTR, appearing at the logic circuit output node 178a (FIG. 5), each state change of which forces the capacitor voltage 204a–204e to equal the input signal 202 by enabling an appropriate one of the charging circuit 155 and the discharging circuit 159 as described above in conjunction with FIG. 5.

Figure 7:
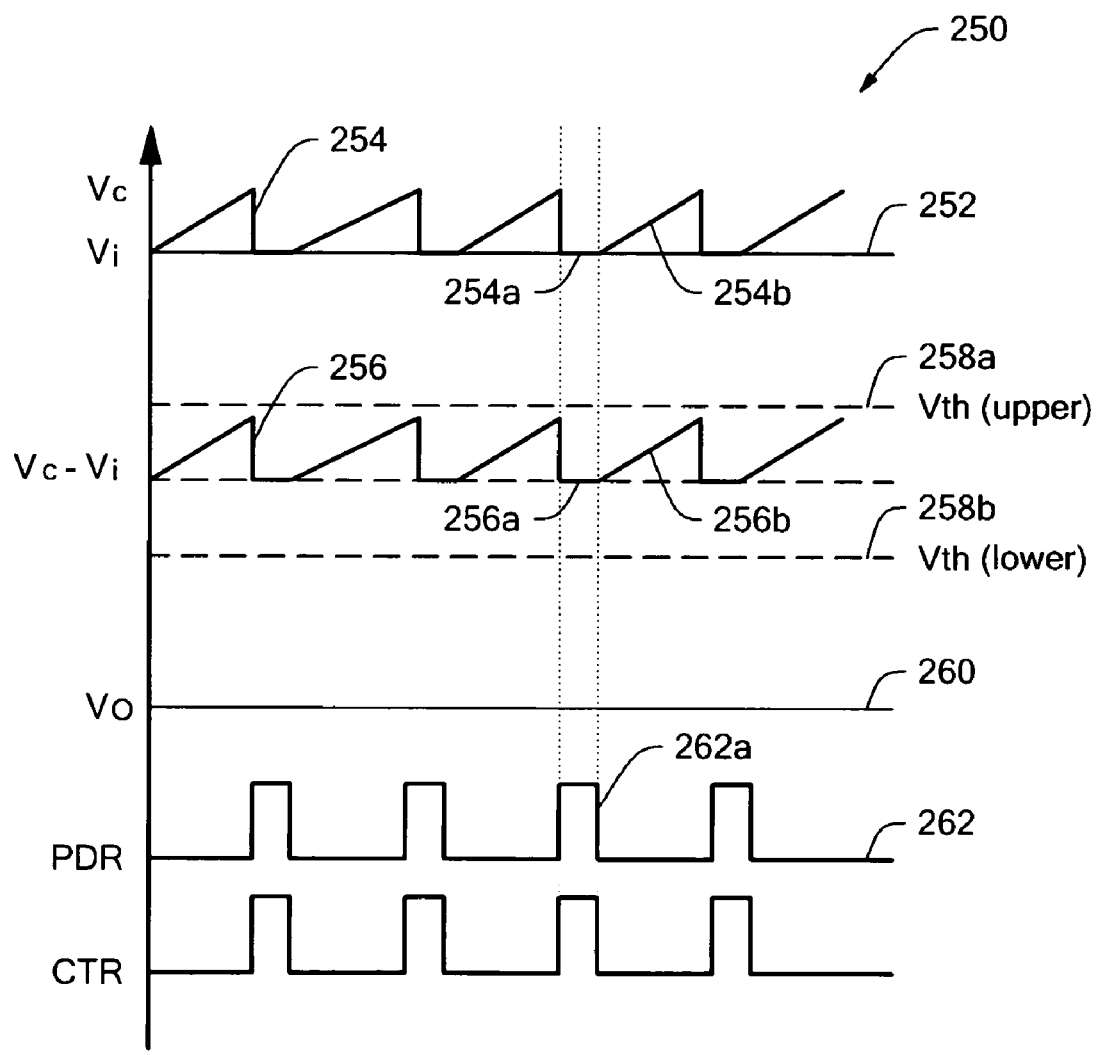
FIG. 7 is a graph showing further details of the operation of the circuit of FIG. 5.

Referring now to FIG. 7, a graph 250 has a horizontal scale in units of time and a vertical scale in units of voltage. A curve 252 is indicative of a DC input voltage 152 (FIG. 5). A curve 254 is representative of a voltage appearing on the capacitor 166 of FIG. 5, which is the same as a voltage appearing at the threshold node 166a of FIG. 5 when the logic circuit 172 of FIG. 5 is operating in the above-described second mode of operation. The curve 254 has flat portions, of which a flat portion 254a is but one example, and sloping portions, of which a sloping portion 254b is but one example. The sloping portions, e.g., 254b, are representative of a positive going voltage drift on the capacitor 166 (FIG. 5). The flat portions, e.g., 254a, are representative of the voltage 254 on the capacitor being forced to equal the input voltage 252 as is further described below.

A curve 256 is representative of a voltage difference, Vc–Vi, between the voltage, Vc, appearing at the threshold node 166a of FIG. 5 (curve 254) and the input voltage, Vi, 152 (curve 252). It can be recognized that the voltage difference, Vc–Vi, is also a difference between the voltage on the two input nodes 168a, 168b of the comparator 168 of FIG. 5. The curve 256 has flat portions, of which a flat portion 256a is but one example, and sloping portions, of which a sloping portion 256b is but one example. The sloping portions, e.g., 256b, are representative of the positive going voltage drift on the capacitor 166. The flat portions, e.g., 256a, are representative of the voltage 254 on the capacitor 166 being forced to equal the input voltage 252.

Two thresholds 258a, 258b correspond to upper and lower thresholds, respectively, of the comparator 168 (FIG. 5). The thresholds 258a, 258b have levels according to a predetermined hysteresis associated with the comparator 168. It should be appreciated that the voltage difference, Vc–Vi, corresponding to the curve 256, does not reach a voltage of either of the thresholds 258a, 258b when the logic circuit 172 is operating in the above-described second mode of operation.

A curve 260 is representative of the output signal 170 appearing at the comparator output node 168a of FIG. 5. Because the curve 256 does not reach a voltage corresponding to the thresholds 258a, 258b, the comparator 168 (FIG. 5) does not change state, and the curve 260 remains at an unchanged state, here shown to be a low state.

A curve 262 shows the PDR signal (FIG. 5) having the PDR pulses, of which pulse 262a is but one example, appearing at the pulse generator output 178a of FIG. 5. Each of the PDR pulses aligns in time and result in a respective flat portion of the curves 254, 256. Each PDR pulse forces the capacitor voltage 254 to equal the input voltage 252 while the pulse is high, for example, by way of the charging/discharging circuit 154 of FIG. 5.

Voltage on the capacitor 166 having voltage drift corresponding to the sloping portions of the curves 254 and 256 would tend to cross the threshold 258a, resulting in a change of state of the comparator 168 (self-switching). However, it should be recognized that the PDR pulses keep the positive voltage drift associated with the curves 254, 256 from crossing the comparator thresholds 258a, 258b, and therefore, the PDR pulses keep the comparator 168 from self-switching in the presence of the voltage drift.

It should be further recognized that similar advantages would be achieved if the voltage drift were negative going, i.e., if the curve 256 were to have ramps with a negative slope instead of the positive slope. It should be still further recognized that similar advantages would be achieved if the output voltage 170 of the comparator 166 shown by the curve 260 were in a positive state instead of a zero state.

While a DC input voltage 152 corresponding to the curve 252 is shown, it will be appreciated that the same concepts apply to a slowly varying input voltage 152.

Figure 8:
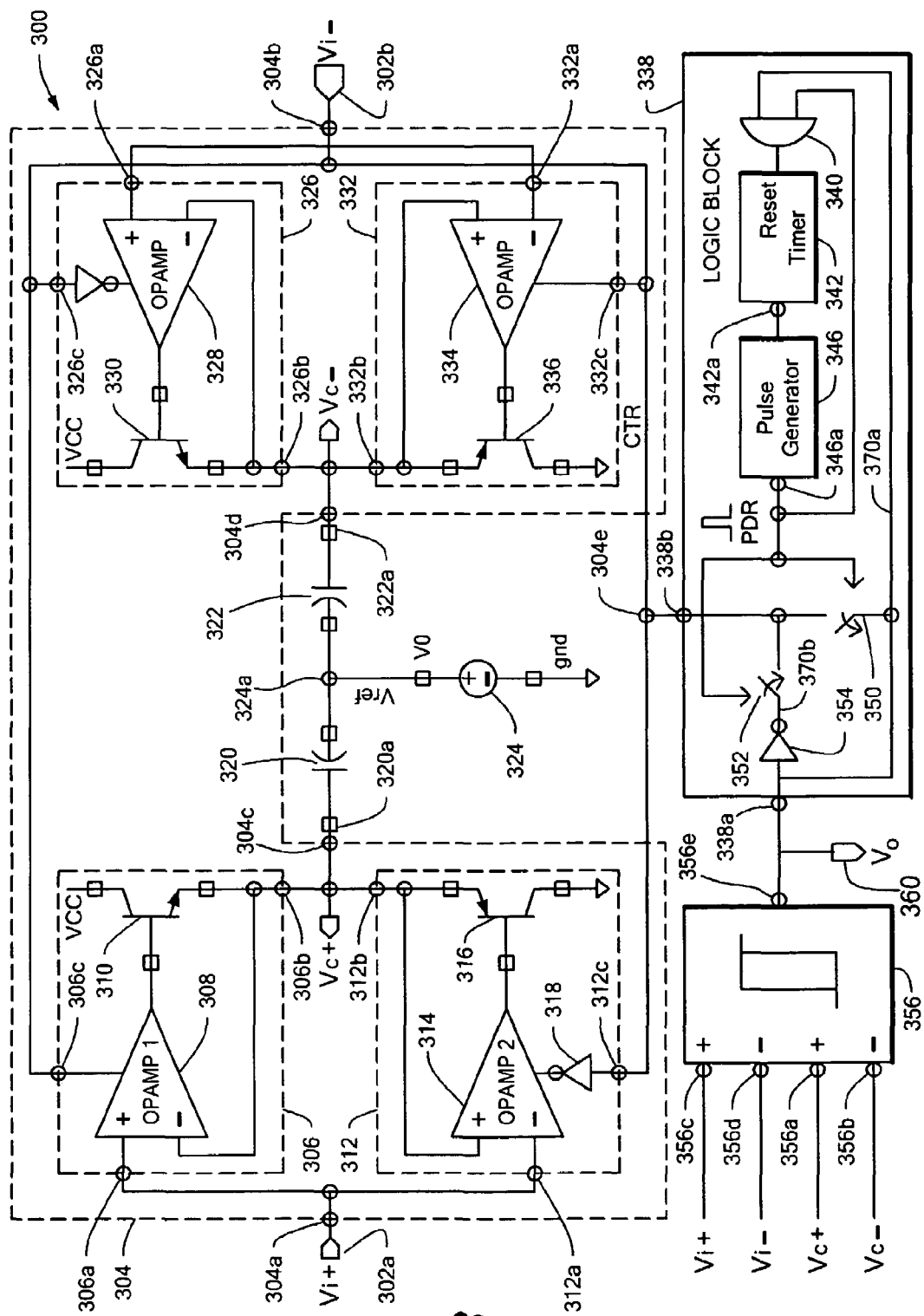
FIG. 8 is a block diagram of a differential circuit able to detect positive and negative peaks of an input signal in accordance with a further embodiment of the invention.

Referring now to FIG. 8, a circuit 300 includes a first capacitor 320 having a first threshold node 320a and a second capacitor 322 having a second threshold node 322a. The circuit 300 further includes a charging/discharging circuit 304 having at least two charging/discharging circuit input nodes 304a, 304b to receive an input signal 302a and an inverted input signal 302b, at least two charging/discharging circuit output nodes 304c, 304d coupled respectively to the first threshold node 320a and to the second threshold node 322a, and an enable/disable node 304e. The circuit further includes a comparator 356 having first differential comparator input nodes 356a, 356b coupled to the first and second threshold nodes 320a, 322a, respectively, second differential comparator input nodes 356c, 356d coupled to respective ones of the at least two charging/discharging circuit input nodes 304a, 304b, and a comparator output node 356e at which a comparator output signal 360 is provided. The circuit 300 still further includes a logic circuit 338 having a logic circuit input node 338a coupled to the comparator output node 356e and a logic circuit output node 338b coupled to the enable/disable node 304e. In some embodiments, the logic circuit 338 includes a gate 340, a timer 342, a pulse generator 346, a first switch 350, a second switch 352, and an inverter 354. A selected one of a first logic circuit output signal 370a and a second logic circuit output signal 370b is provided at the logic circuit output node 338b in response to a predetermined period of time during which the comparator output signal 360 has no output signal transitions.

In some embodiments, the charging/discharging circuit 304 includes a first charging circuit 306 having a first charging circuit input node 306a to receive the input signal 302a, a first charging circuit output node 306b coupled to the first threshold node 320a, and a first charging circuit enable input node 306c coupled to the logic circuit output node 338b. The charging/discharging circuit 304 further includes a first discharging circuit 312 having a first discharging circuit input node 312a to receive the input signal 302a, a first discharging circuit output node 312b coupled to the first threshold node 320a, and a first discharging circuit inverted enable input node 312c coupled to the logic circuit output node 338b. The charging/discharging circuit 304 still further includes a second charging circuit 326 having a second charging circuit input node 326a to receive the inverted input signal 302b, a second charging circuit output node 326b coupled to the second threshold node 322a, and a second charging circuit inverted enable input node 322c coupled to the logic circuit output node 338b. The charging/discharging circuit 304 still further includes a second discharging circuit 332 having a second discharging circuit input node 332a to receive the inverted input signal 302b, a second discharging circuit output node 332b coupled to the second threshold node 322a, and a second discharging circuit enable input node 332c coupled to the logic circuit output node 338b.

In some embodiments, the first charging circuit 306, the first discharging circuit 312, the second charging circuit 326, and the second discharging circuit 332 include an amplifier 308, 314, 328, 334, respectively, and a transistor 310, 316, 330, 336, respectively. In some further embodiments, the first capacitor 320, the second capacitor 322, the charging/discharging circuit 304, the comparator 356, and the logic circuit 338 are provided on a common substrate (not shown).

In operation, the first charging circuit 306 and the second discharging circuit 332 are enabled or disabled together and the second charging circuit 312 and the first discharging circuit 326 are enabled or disabled together in accordance with a state of a control signal, CTR, applied to the enable inputs 306c, 332c and to the inverted enable inputs 312c, 326c. The charging/discharging circuit 304 provides charging/discharging signals at the at least two charging/discharging circuit output nodes 304c, 304d to charge the first capacitor 320 to a voltage in accordance with a positive peak of the input signal 302a and to discharge the second capacitor 322 to a voltage in accordance with a negative peak of the inverted input signal 302b. The charging/discharging circuit 304 provides charging/discharging signals at the at least two charging/discharging circuit output nodes 304c, 304d to discharge the first capacitor 320 to a voltage in accordance with a negative peak of the input signal 302a and to charge the second capacitor 322 to a voltage in accordance with a positive peak of the inverted input signal 302b. The comparator is responsive to a voltage difference $((Vc+)-Vc-)-((Vi+)-Vi-)$.

When the first charging circuit 306 is enabled, which can only charge the capacitor 320, reaching the positive peak voltage of the input signal 302a results in the capacitor 320 holding the positive peak voltage of the input signal 302 at the first threshold node 302a. When the second discharging circuit 332 is enabled (at the same time that the first charging circuit 306 is enabled), which can only discharge the capacitor 322, reaching the negative peak voltage of the inverted input signal 302b results in the capacitor 322 holding the negative peak voltage of the inverted input signal 302b at the second threshold node 322a. When the input signal 302a thereafter begins to transition to a lower voltage and the inverted input signal 302b thereafter begins to transition to a higher voltage, causing the voltage difference, $((Vc+)-Vc-)-((Vi+)-Vi-)$, to increase and cross an upper threshold of the comparator 356, a change in state occurs at the comparator output node 356e.

More specifically, once enabled, the first charging circuit 306 tends to force a voltage on the first capacitor 320 that follows the voltage of the input signal 302a as it moves upward, and the second discharging circuit 332 tends to force a voltage on the second capacitor 322 that follows the voltage of the inverted input signal 302b as it moves downward, causing the comparator inputs 356a, 356c to become substantially equal and the comparator inputs 356b, 356d to become substantially equal, i.e., (Vc+)–Vi+ and (Vc–)–Vi– are both substantially equal to zero. Therefore, while the input signal 302a increases in voltage and the inverted input signal 302b decreases in voltage, the voltage difference, ((Vc+)−Vc−)−((Vi+)−Vi−), remains between the two thresholds of the comparator 356 and the comparator 356 remains in the low state.

When the second charging circuit 326 is enabled, which can only charge the capacitor 322, reaching the positive peak voltage of the inverted input signal 302b results in the capacitor 322 holding the positive peak voltage of the inverted input signal 302b at the second threshold node 322a. When the first discharging circuit 312 is enabled (at the same time that the second charging circuit 326 is enabled), which can only discharge the capacitor 320, reaching the negative peak voltage of the input signal 302a results in the capacitor 320 holding the negative peak voltage of the input signal 302a at the first threshold node 320a. When the inverted input signal 302b thereafter begins to transition to a lower voltage and the input signal 302a thereafter begins to transition to a higher voltage, causing the voltage difference, ((Vc+)−Vc−)−((Vi+)−Vi−), to decrease and cross the lower threshold of the comparator 356, a change in state occurs at the comparator output node 356e.

More specifically, once enabled, the second charging circuit 326 tends to force a voltage on the second capacitor 322 that follows the voltage of the inverted input signal 302b as it moves upward, and the first discharging circuit 312 tends to force a voltage on the second capacitor 322 that follows the voltage of the input signal 302a as it moves downward, causing the comparator inputs 356a, 356c to become substantially equal and the comparator inputs 356b, 356d to become substantially equal, i.e., (Vc+)−Vi+ and (Vc−)−Vi− are both substantially equal to zero. Therefore, while the input signal 302a decreases in voltage and the inverted input signal 302b increases in voltage, the voltage difference, ((Vc+)−Vc−)−((Vi+)−Vi−), remains between the two thresholds of the comparator 356 and the comparator 356 remains in the high state. Operation of the circuit 300 will be further understood from the discussion of FIG. 6 above, where Vc is replaced by (Vc+)−Vc− and Vi is replaced by (Vi+)−Vi−.

In a first mode of operation of the logic circuit 338, achieved when the input signal and inverted input signal 302a, 302b, respectively, are varying in voltage, the logic circuit 338 generates a steady state (DC) PDR signal at the logic circuit output node 338a. In the first mode of operation, the timer 342 is repeatedly reset by changes in state of the comparator output signal 360 caused by the varying input signal and inverted input signal 302a, 302b. In this mode of operation, the pulse generator 346 remains in a low state resulting in the first switch 350 being closed and the second switch 352 being open. Therefore, the output signal 360 of the comparator 356 is directed to the logic circuit output node 338b, and the comparator output signal 360 becomes the control signal, CTR. When the CTR signal is low (i.e., the comparator output signal 360 is low), the first charging circuit 306 and the second discharging circuit 332 are enabled and the second charging circuit 326 and the first discharging circuit 312 are disabled. Conversely, when the CTR signal is high (i.e., the comparator output signal 170 is high), the first charging circuit 306 and the second discharging circuit 332 are disabled and the second charging circuit 326 and the first discharging circuit 312 are enabled.

In a second mode of operation of the logic circuit 172, achieved when the input signal and the inverted input signal 302a, 302b are slowly varying or DC, the output of the comparator 356 either has transitions widely spaced in time or no transition, respectively, resulting in either widely spaced resets or no resets applied to the timer 342. Taking, for example, a DC input signal 302a and a corresponding DC inverted input signal 302b, which results in no resets applied to the timer 342, the timer 342 counts up to a terminal count in a predetermined amount of time, at which time an output 342a of the timer 342 provides a transition, causing the pulse generator 346 (e.g., monostable multivibrator) to output a high state PDR signal (i.e., a PDR pulse) at a pulse generator output node 346a.

While the PDR signal is high, the first switch 350 is open and the second switch 352 is closed resulting in the inverse of the comparator output signal 360 being directed to the logic circuit output node 338b and the inverse of the comparator output signal 360, via the inverter 354, becomes the control signal, CTR. In this condition, the first charging circuit 306 and the second discharging circuit 332 are enabled and the second charging circuit 326 and the first discharging circuit 312 are disabled when the CTR signal is low (i.e., the comparator output signal 360 is high). Also, the first charging circuit 306 and the second discharging circuit 332 are disabled and the second charging circuit 326 and the first discharging circuit 312 are enabled when the CTR signal is high (i.e., the comparator output signal 360 is low).

While the PDR signal is low, the first switch 350 is closed and the second switch 352 is open resulting in the comparator output signal 360 being directed to the logic circuit output node 338b to become the control signal, CTR. In this condition, the first charging circuit 306 and the second discharging circuit 332 are enabled and the second charging circuit 326 and the first discharging circuit 312 are disabled when the CTR signal is low (i.e., the comparator output signal 360 is low). Also, the first charging circuit 306 and the second discharging circuit 332 are disabled and the second charging circuit 326 and the first discharging circuit 312 are enabled when the CTR signal is high (i.e., the comparator output signal 360 is high).

The PDR signal is also coupled to the gate 340, and when a PDR pulse appears on the PDR signal, the timer 342 is reset. When the PDR pulse terminates, the timer 342 again counts, reaching its terminal count after the predetermined time and another PDR pulse is generated. With this arrangement, the logic circuit 338 continually generates PDR pulses so long as the input signal 302a and the inverted input signal 302b remain unchanged or slowly varying.

Operation of the circuit 300 is very similar to operation of the circuit 150 of FIG. 5, but operating in a differential mode. Operation can be understood from the graphs 200, 250 of FIGS. 6 and 7, respectively, but with Vi replaced by (Vi+)−Vi−, Vc replaced by (Vc+)−Vc−, and Vc−Vi replaced by ((Vc+)−Vc−)−((Vi+)−Vi−). Therefore, operation of the circuit 300 is not further described herein.

Figure 9:
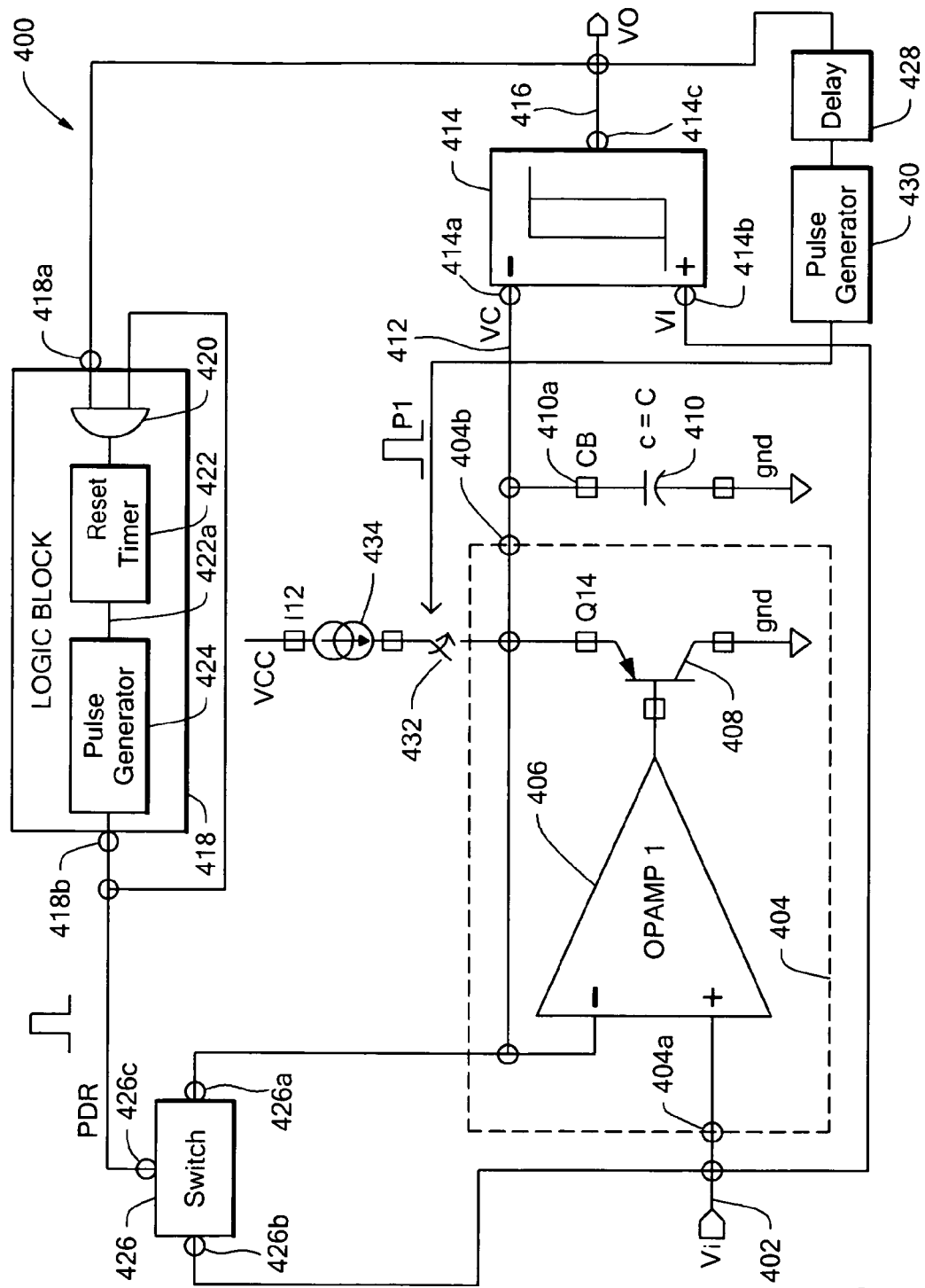
FIG. 9 is a block diagram of a circuit able to detect negative peaks of an input signal in accordance with the present invention.

Referring now to FIG. 9, a circuit 400 includes a capacitor 410 having a threshold node 410a. The circuit 400 also includes a discharging circuit 404 having a discharging circuit input node 404a to receive an input signal 402 and a discharging circuit output node 404b coupled to the threshold node 410a.

The circuit 400 also includes a comparator 414 having a first comparator input node 414a coupled to the threshold node 410a, a second comparator input node 414b coupled to the discharging circuit input node 404a, and a comparator output node 414c at which a comparator output signal 416 is provided. The comparator 414 provides the comparator output signal 416 at the comparator output node 414c in response to a voltage difference, Vi−Vc, between a voltage, Vi, of the input signal 402, and a voltage, Vc, at the threshold node 410a. The comparator 414 can be arranged having two thresholds to provide hysteresis, an upper threshold and a lower threshold.

The circuit 400 still further includes a logic circuit 418 having a logic circuit input node 418a coupled to the comparator output node 414c and a logic circuit output node 418b at which a logic circuit output signal, PDR, is provided in response to a predetermined period of time during which the comparator output signal 416 has no transitions. The circuit 400 still further includes a switch 426 having a first switch node 426a coupled to the threshold node 410a, a second switch node 426b coupled to the discharging circuit input node 404a, and a switch control node 426c coupled to the logic circuit output node 418b. In some embodiments, the circuit 400 also includes a delay module 428, a pulse generator 430, a switch 432, and a current source 434.

In some embodiments, the discharging circuit 404 includes an amplifier 406 and a transistor 408. In some further embodiments, the logic circuit 418 includes a gate 420, a timer 422, and a pulse generator 424 (monostable multivibrator). Also, in some embodiments, at least the capacitor 410, the discharging circuit 404, the comparator 414, the logic circuit 418, and the switch 426 are provided on a common substrate.

In operation, the discharging circuit 404 provides a discharging signal at the discharging circuit output node 404b to discharge the capacitor 410 to a voltage in accordance with a negative peak of the input signal 402. The discharging circuit 404 can only discharge the capacitor 410. Therefore, upon reaching the negative peak voltage of the input signal 402, the capacitor 410 holds the negative peak voltage of the input signal 402 at the threshold node 410a. When the input signal 402 thereafter begins to transition to a higher voltage, causing the voltage difference, Vi–Vc, to increase and cross an upper threshold of the comparator 414, a change in state, for example, a change to a high state, occurs at the comparator output node 414c. Therefore, the change in state at the comparator output node 414c can be used to detect a first negative peak of the input signal 402.

The pulse generator 430 generates pulse, P1, shortly after each transition of the output signal 416 to a high state, at a time in accordance with the delay module 428. The pulse, P1, operates via the switch 432 and the current source 434 to move the voltage at the threshold node 410a slightly upward. The shift in voltage at the threshold node 410a results in the comparator output signal 416 taking on a low state (i.e., resetting the comparator 414) when the input signal 402 reaches the voltage at the threshold node 410a. The circuit 400, therefore, becomes ready to detect the next negative peak of the input signal 402.

In a first mode of operation of the logic circuit 418, achieved when the input signal 402 is varying in voltage, the logic circuit 418 generates a steady state (DC) PDR signal (e.g., a low state) at the logic circuit output node 418b. In the first mode of operation, the timer 422 is repeatedly reset by changes in state of the comparator output signal 416 caused by the varying input voltage 402, resulting in the continual low state at the logic circuit output node 418b. In this mode of operation, the switch 426 remains open and the circuit 400 operates as described above.

In a second mode of operation of the logic circuit 418, achieved when the input signal 402 is slowly varying or DC, the logic circuit 418 generates a PDR signal having high and low states (i.e., PDR pulses) at the output node 418b. In this mode of operation, the output of the comparator 414 either has transitions widely spaced in time or no transitions, respectively, resulting in either widely spaced resets to the timer 422 or no resets, respectively. Taking, for example, a DC input signal 402, which results in no resets applied to the timer 422, the timer 422 counts up to a terminal count in a predetermined amount of time, at which time an output 422a of the timer 422 makes a transition, causing the pulse generator 424 (e.g., monostable multivibrator) to output a high state PDR signal (a PDR pulse) at the logic circuit output node 418b.

The PDR signal is received by the switch 426 at the switch control node 426c. During a time when the PDR signal is in the high state, i.e., during the PDR pulse, the capacitor 410 is coupled to the input signal 402 by way of the switch 426, forcing the voltage on the capacitor 410 (which may otherwise be experiencing voltage drift) to substantially equal the voltage of the input signal 402, and therefore, forcing the voltage at the threshold node 410a, to take on the voltage of the input signal 402 (i.e., Vi–Vc=0). It will be recognized that this condition prevents switching of the comparator 414.

The PDR signal is also coupled to a gate 420 and forces the timer 422 to reset. When the PDR pulse terminates (i.e., the state at the node 418b returns to its original state), the timer 422 again counts, again reaching its terminal count after the predetermined time and another PDR pulse is generated. With this arrangement, the logic circuit 418 continually generates PDR pulses so long as the input signal 402 remains generally unchanged. It will be recognized that PDR pulses can also be generated for an input signal 402 that is slowly varying.

In the second mode of operation of the logic circuit 418, during a time when the PDR signal is at a low state, i.e., between PDR pulses, the circuit 400 operates as described above in the first mode of operation of the logic circuit 418.

When in the above-described second mode of operation of the logic circuit 418, self-switching of the comparator 414 is reduced or eliminated so long as the voltage at the threshold node 410a is not allowed to deviate very far from the voltage of the input signal 402, which can be accomplished by generating PDR pulses sufficiently close together.

Operation of the circuit 400 is very similar to operation of the circuit 50 of FIG. 2, but responsive to negative peaks of the input signal rather than to positive peaks. Operation can be understood from the graphs 100, 120 of FIGS. 3 and 4, respectively, but where Vc–Vi is replaced by Vi–Vc. Therefore, operation of the circuit 400 is not further described herein.

It will be understood that in embodiments described above for which capacitors are provided on a common substrate with other circuit components (i.e., integrated capacitors), the integrated capacitors provide better immunity than external discrete capacitors against noise coupled from external noise sources. Furthermore, capacitors having a low capacitance value (e.g., one hundred picoFarads) can be used.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit, comprising:
a capacitor having a threshold node;
a selected one of:

a charging circuit having a charging circuit input node to receive an input signal and a charging circuit output node coupled to the threshold node, wherein the charging circuit is adapted to provide a charging signal at the charging circuit output node to charge the capacitor to a voltage in accordance with a positive peak of the input signal, and a discharging circuit having a discharging circuit input node to receive an input signal and a discharging circuit output node coupled to the threshold node, wherein the discharging circuit is adapted to provide a discharging signal at the discharging circuit output node to discharge the capacitor to a voltage in accordance with a negative peak of the input signal;

a comparator having a first comparator input node coupled to the threshold node, a second comparator input node coupled to the input node of the selected one of the charging circuit and the discharging circuit, and a comparator output node at which a comparator output signal is provided;

a logic circuit having a logic circuit input node coupled to the comparator output node and a logic circuit output node at which a logic circuit output signal is provided in response to a predetermined period of time during which the comparator output signal has no transitions; and a switch having a first switch node coupled to the threshold node, a second switch node coupled to the selected one of the charging circuit input node and the discharging circuit input node, and a switch control node coupled to the logic circuit output node.

2. The circuit of claim 1, wherein the switch is adapted to force a voltage on the capacitor to substantially equal a voltage in accordance with the input signal in response to the logic circuit output signal.

3. The circuit of claim 1, wherein the logic circuit comprises:

a timer to generate a timer signal; and a pulse generator coupled to the timer to generate a pulse associated with the logic circuit output signal in response to the timer signal.

4. The circuit of claim 3, wherein the pulse generator comprises a monostable multivibrator.

5. The circuit of claim 1, wherein the predetermined period of time is selected in accordance with a rate of change of the input signal.

6. The circuit of claim 1, wherein the capacitor, the selected one of the charging circuit and the discharging circuit, the comparator, the logic circuit, and the switch are provided on a common substrate.

7. The circuit of claim 1, wherein the circuit is adapted to provide the comparator output signal in response to a motion of a ferrous object.

8. The circuit of claim 1, wherein the circuit is adapted to provide the comparator output signal in response to a motion of a magnet.

9. The circuit of claim 1, further including:

a delay module having a delay module input node coupled to the comparator output node and having a delay module output node;

a pulse generator having a pulse generator input node coupled to the delay module output node and having a pulse generator output node;

a current source having a current source output node; and a level-shift switch having a first level-shift switch node coupled to the threshold node, a second level-shift switch node coupled to the current source output node, and a level-shift switch control node coupled to the pulse generator output node.

10. A circuit, comprising;

a capacitor having a threshold node;

a charging/discharging circuit comprising:

a charging circuit having a charging circuit input node to receive an input signal, a charging circuit output node coupled to the threshold node, and an enable node; and a discharging circuit having a discharging circuit input node to receive the input signal, a discharging circuit output node coupled to the threshold node, and an inverted enable input node, wherein the charging circuit is adapted to provide a charging signal at the charging circuit output node to charge the capacitor to a voltage in accordance with a positive peak of the input signal and the discharging circuit is adapted to provide a discharging signal at the discharging circuit output node to discharge the capacitor to a voltage in accordance with a negative peak of the input signal;

a comparator having a first comparator input node coupled to the threshold node, a second comparator input node coupled to the charging and discharging circuit input nodes, and a comparator output node at which a comparator output signal is provided; and a logic circuit having a logic circuit input node coupled to the comparator output node a logic circuit output node coupled to the enable input node and to the inverted enable input node, wherein a selected one of a first logic circuit output signal and a second logic circuit output signal is provided at the logic circuit output node in response to a predetermined period of time during which the comparator output signal has no output signal transitions.

11. The circuit of claim 10, wherein the first logic circuit output signal is associated with the comparator output signal and the second logic circuit output signal is a pulse signal.

12. The circuit of claim 10, wherein the charging/discharging circuit is adapted to force a voltage on the capacitor to substantially equal a voltage in accordance with the input signal in response to the logic circuit output signal.

13. The circuit of claim 10, wherein the logic circuit comprises:

a timer to generate a timer signal; and a pulse generator coupled to the timer and having an output node at which a PDR pulse is generated in response to the timer signal.

14. The circuit of claim 13, further including:

a commutation circuit having a first commutation circuit node coupled to the enable node and to the inverted enable node, a second commutation circuit node coupled to the comparator output node, and a third commutation circuit node coupled to the pulse generator output node.

15. The circuit of claim 13, wherein the pulse generator comprises a monostable multivibrator.

16. The circuit of claim 10, wherein predetermined period of time is selected in accordance with a rate of change of the input signal.

17. The circuit of claim 10, wherein the capacitor, the charging circuit, the discharging circuit, the comparator, and the logic circuit, are provided on a common substrate.

18. The circuit of claim 10, wherein the circuit is adapted to provide the comparator output signal in response to a motion of a ferrous object.

19. The circuit of claim 10, wherein the circuit is adapted to provide the comparator output signal in response to a motion of a magnet.

20. A circuit, comprising;
a first capacitor having a first threshold node;
a second capacitor having a second threshold node;
a charging/discharging circuit having at least two charging/discharging circuit input nodes to receive an input signal and an inverted input signal, at least two charging/dischargingcircuit output nodes coupled respectively to the first threshold node and to the second threshold node, and an enable/disable node, wherein the charging/discharging circuit is adapted to provide charging signals at the at least two charging/discharging circuit output nodes to charge the first capacitor to a voltage in accordance with a positive peak of the input signal and to charge the second capacitor to a voltage in accordance with a positive peak of the inverted input signal, and wherein the charging/dischargingcircuit is adapted to provide discharging signals at the at least two charging/discharging circuit output nodes to discharge the first capacitor to a voltage in accordance with a negative peak of the input signal and to discharge the second capacitor to a voltage in accordance with a negative peak of the inverted input signal;
a comparator having first differential comparator input nodes coupled to the first and second threshold nodes, second differential comparator input nodes coupled to respective ones of the at least two charging/discharging circuit input nodes, and a comparator output node at which a comparator output signal is provided; and
a logic circuit having a logic circuit input node coupled to the comparator output node and a logic circuit output node coupled to the enable/disable node, wherein a selected one of a first logic circuit output signal and a second logic circuit output signal is provided at the logic circuit output node in response to a predetermined period of time during which the comparator output signal has no transitions.

21. The circuit of claim 20, wherein the first logic circuit output signal is associated with the comparator output signal and the second logic circuit output signal is a pulse signal.

22. The circuit of claim 20, wherein the charging/discharging circuit comprises:
a first charging circuit having a first charging circuit input node to receive the input signal, a first charging circuit output node coupled to the first threshold node, and a first charging circuit enable input node coupled to the logic circuit output node;
a first discharging circuit having a first discharging circuit input node to receive the input signal, a first discharging circuit output node coupled to the first threshold node, and a first discharging circuit inverted enable input node coupled to the logic circuit output node;
a second charging circuit having a second charging circuit input node to receive the inverted input signal, a second charging circuit output node coupled to the second threshold node, and a second charging circuit inverted enable input node coupled to the logic circuit output node; and
a second discharging circuit having a second discharging circuit input node to receive the inverted input signal, a second discharging circuit output node coupled to the second threshold node, and a second discharging circuit enable input node coupled to the logic circuit output node, wherein the first charging circuit is adapted to provide a first charging signal at the first charging circuit output node to charge the first capacitor to a voltage in accordance with a positive peak of the input signal, the first discharging circuit is adapted to provide a first discharging signal at the first discharging circuit output node to discharge the first capacitor to a voltage in accordance with a negative peak of the input signal, the second charging circuit is adapted to provide a second charging signal at the second charging circuit output node to charge the second capacitor to a voltage in accordance with the positive peak of the inverted input signal, and the second discharging circuit is adapted to provide a second discharging signal at the second discharging circuit output node to discharge the second capacitor to a voltage in accordance with the negative peak of the inverted input signal.

23. The circuit of claim 20, wherein the charging/discharging circuit is adapted to force a voltage on the first capacitor to substantially equal a voltage in accordance with the input signal and to force a voltage on the second capacitor to substantially equal a voltage in accordance with the inverted input signal in response to the logic circuit output signal.

24. The circuit of claim 20, wherein the logic circuit comprises:
a timer to generate a timer signal; and
a pulse generator coupled to the timer to generate a pulse associated with the logic circuit output signal in response to the timer signal.

25. The circuit of claim 24, wherein the pulse generator comprises a monostable multivibrator.

26. The circuit of claim 20, further including:
a commutation circuit having a first commutation circuit node coupled to the first and second charging circuit enable and inverted enable input nodes respectively and to the first and second discharging circuit inverted enable and enable input nodes respectively, a second commutation circuit node coupled to the comparator output node, and a third commutation circuit node coupled to the pulse generator output node.

27. The circuit of claim 20, wherein predetermined period of time is selected in accordance with a rate of change of the input signal.

28. The circuit of claim 20, wherein the capacitor, the charging circuits, the discharging circuits, the comparator, and the logic circuit, are provided on a common substrate.

29. The circuit of claim 20, wherein the circuit is adapted to provide the comparator output signal in response to a motion of a ferrous object.

30. The circuit of claim 20, wherein the circuit is adapted to provide the comparator output signal in response to a motion of a magnet.

* * * * *

UNITED STATES PATENT AND TRADEMARK OFFICE
CERTIFICATE OF CORRECTION

PATENT NO. : 7,053,674 B1 Page 1 of 1
APPLICATION NO. : 11/010704
DATED : May 30, 2006
INVENTOR(S) : Romero et al.

It is certified that error appears in the above-identified patent and that said Letters Patent is hereby corrected as shown below:

Column 2, line 10 delete "in accordance the" and replace with --in accordance with the--.

Column 2, line 37 delete "can results" and replace with --can result--.

Column 4, line 26 delete "charging/dischargingcircuit" and replace with --charging/discharging circuit--.

Column 4, line 31 delete "charging/dischargingcircuit" and replace with --charging/discharging circuit--.

Column 11, lines 39-40 delete ",in on particular" and replace with --, in one particular--

Column 21, lines 9-10 delete "charging/dischargingcircuit" and replace with --charging/discharging circuit--.

Column 21, lines 19-20 delete "charging/dischargingcircuit" and replace with -- charging/discharging circuit--.

Signed and Sealed this

Sixteenth Day of January, 2007

JON W. DUDAS
*Director of the United States Patent and Trademark Office*